United States Patent
Le et al.

(10) Patent No.: US 9,117,666 B2
(45) Date of Patent: Aug. 25, 2015

(54) METHOD FOR ACTIVATING A POROUS LAYER SURFACE

(71) Applicants: IMEC VZW, Leuven (BE); Katholieke Universiteit Leuven, KU LEUVEN R&D, Leuven (BE)

(72) Inventors: Quoc Toan Le, Belgrade (BE); Mikhail Baklanov, Veltem-Beisem (BE); Yiting Sun, Leuven (BE); Silvia Armini, Leuven (BE)

(73) Assignees: IMEC VZW, Leuven (BG); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 14/555,356

(22) Filed: Nov. 26, 2014

(65) Prior Publication Data
US 2015/0170910 A1    Jun. 18, 2015

(30) Foreign Application Priority Data

Dec. 16, 2013 (EP) .................................... 13197472

(51) Int. Cl.
*H01L 21/469* (2006.01)
*H01L 21/02* (2006.01)

(52) U.S. Cl.
CPC .... *H01L 21/02359* (2013.01); *H01L 21/02343* (2013.01)

(58) Field of Classification Search
CPC ................... H01L 21/02203; H01L 21/02359; H01L 21/02362; H01L 21/02343; H01L 21/76814
USPC ........................................ 438/778; 216/56, 67
See application file for complete search history.

(56) References Cited

U.S. PATENT DOCUMENTS

| | | | |
|---|---|---|---|
| 7,166,531 B1 | 1/2007 | Van den Hoek et al. | |
| 7,223,705 B2 * | 5/2007 | Sriram et al. | 438/781 |
| 8,540,890 B2 * | 9/2013 | Baklanov et al. | 216/56 |
| 8,961,803 B1 * | 2/2015 | Baklanov | 216/56 |
| 2002/0115285 A1 | 8/2002 | Wong | |
| 2005/0148202 A1 * | 7/2005 | Heiliger et al. | 438/778 |
| 2005/0265911 A1 * | 12/2005 | Yuan | 423/220 |
| 2005/0274671 A1 * | 12/2005 | Fages et al. | 210/634 |
| 2006/0027929 A1 * | 2/2006 | Cooney et al. | 257/758 |
| 2007/0111535 A1 | 5/2007 | Yu et al. | |
| 2008/0118995 A1 * | 5/2008 | Tamboli et al. | 438/4 |
| 2013/0320520 A1 | 12/2013 | Michalak et al. | |

OTHER PUBLICATIONS

Sun et al., Solid State Phenom. 195, 146 (2013).
Baklanov et al., J. Appl. Phys. 113, 041101 (2013); doi: 10.1063/1.4765297.
Frot et al., *Adv. Mater.* 2011, 23, 2828-2832.

* cited by examiner

*Primary Examiner* — Savitr Mulpuri
(74) *Attorney, Agent, or Firm* — Knobbe Martens Olson & Bear, LLP

(57) ABSTRACT

A method is provided for activating an exposed surface of a porous dielectric layer, the method comprising the steps of: filling with a first liquid at least the pores present in a part of the porous dielectric layer, the part comprising the exposed surface, removing the first liquid selectively from the surface, activating the exposed surface, and removing the first liquid from the bulk part of the porous dielectric layer.

11 Claims, 4 Drawing Sheets

METHOD FOR ACTIVATING A POROUS LAYER SURFACE

CROSS REFERENCE TO RELATED APPLICATION

Any and all priority claims identified in the Application Data Sheet, or any correction thereto, are hereby incorporated by reference under 37 CFR 1.57. This application claims the benefit of EP 13197472.7 filed Dec. 16, 2013. The aforementioned application is incorporated by reference herein in its entirety, and is hereby expressly made a part of this specification.

TECHNICAL FIELD OF THE INVENTION

Surface treatments, more specifically protective surface treatments of porous dielectric materials prior to the sealing thereof, are provided. Also provided are devices obtained via such treatments and in particular to semiconductor devices.

BACKGROUND OF THE INVENTION

Low dielectric constant (low-k) materials are developed to meet the ever increasing challenges in the IC industry in terms of RC delay. These low-k materials are typically highly porous in order to decrease the k value. For porous dielectric films to meet the standards for integration into the next generation microelectronic devices, the pores are preferably sealed to prevent diffusion of metal ions, water and chemical precursors from barrier and seed deposition steps, such as etching and chemical mechanical planarization.

In Y. Sun et al. (Solid State Phenom. 195, 146 (2013)), a novel pore sealing approach is described wherein a self-assembled monolayer (SAM) is deposited on a porous substrate, followed by the deposition of a thin TiN layer. Before the SAM layer deposition, the dielectric surface needed to be modified/activated in order to make it more reactive toward the sealing layer. This was performed by the introduction of hydroxyl groups via a plasma treatment. However, the used plasma technique showed poor selectivity toward the surface versus the bulk of the film (FIG. 1), meaning that the film was also modified in its bulk. As a consequence, the SAM molecules were not only deposited on the surface but also inside the pores in the sub-surface region, which resulted in a significant increase in the k-value of the dielectric film.

SUMMARY OF THE INVENTION

There is therefore a need in the art for new methods permitting surface activation of porous dielectric layers with good surface selectivity so that the treatments occur preferably at the surface of the layer and less in the bulk of the layer.

An object of various embodiments is to provide a method which permits to raise the reactivity of a porous dielectric material surface in such a way as to enable a subsequent sealing layer deposition without significantly increasing the k value of the porous dielectric layer.

The above objective is accomplished by a method according to embodiments.

In a first aspect, a method is provided for enhancing the reactivity of an exposed surface of a porous dielectric layer comprising:
  i. a bulk part comprising a bulk material and pores, and
  ii. the exposed surface,
  the method comprising the steps of:

I. Filling with a first liquid at least the pores present in a part of the porous dielectric layer, the part comprising the exposed surface,
  II. Removing the first liquid selectively from the exposed surface,
  III. Enhancing the reactivity of the exposed surface, thereby forming an activated exposed surface more reactive than the exposed surface toward a sealing layer,
  IV. Removing the first liquid from the bulk part of the porous dielectric layer, Preferably, steps I, II, and III are performed while keeping the first liquid in the liquid state.

The embodiments permit increasing the reactivity of the exposed surface of a porous dielectric layer while ensuring that the reactivity of the bulk of the porous dielectric layer is not significantly raised. This advantageously permits, for example, applying a sealing layer on the porous dielectric layer without or with very limited presence of the sealing layer below the exposed surface of the porous dielectric layer (inside the pores in the sub-surface region). This permits keeping the k-value of the porous dielectric layer substantially unchanged.

In a second aspect, a device is provided comprising a porous dielectric layer comprising a bulk part and a surface part, wherein the reactivity of the surface part is higher than the reactivity of the bulk part, the surface part having a thickness of from 0.1 to 4 nm. Such a device is obtainable by a method according to embodiments of the first aspect.

Such a device is advantageous as it permits the deposition of a sealing layer thereon, without that sealing layer entering pores below the exposed surface of the porous dielectric layer. This permits a porous dielectric layer having substantially the same k value before and after the deposition of the sealing layer. In embodiments, the k value of the porous dielectric layer after the performance of the method may be within 5%, preferably within 2% and more preferably within 1% of the k value before performance of the method.

In embodiments, the device may further comprise a sealing layer deposited (e.g., selectively deposited and/or chemically grafted) on the surface part, wherein the sealing layer penetrates the porous dielectric layer over a thickness of from 0 to 4 nm.

Particular and preferred aspects of the invention are set out herein. Features may be combined with other features as appropriate and not merely as explicitly set out herein.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
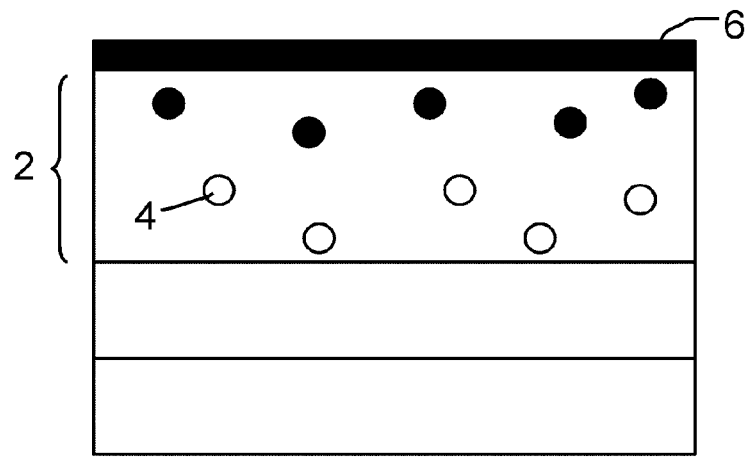
FIG. 1 is a diagrammatic illustration of a device comprising a porous dielectric layer and a sealing layer according to the prior art.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The dimensions and the relative dimensions do not correspond to actual reductions to practice of the invention.

Furthermore, the terms "first", "second", "third" and the like, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", "under" and the like are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the invention requires more features than are expressly recited. Rather, inventive aspects lie in less than all features of a single foregoing disclosed embodiment.

Furthermore, while some embodiments described herein include some but not other features included in other embodiments, combinations of features of different embodiments are meant to be within the scope of the invention, and form different embodiments, as would be understood by those in the art. For example, any of the embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, a method is provided for enhancing the reactivity of an exposed surface of a porous dielectric layer comprising:
 i. a bulk part comprising a bulk material and pores, and
 ii. the exposed surface,
the method comprising the steps of:
 I. Filling with a first liquid at least the pores present in a part (or portion) of the porous dielectric layer, the part comprising the exposed surface,
 II. Removing the first liquid selectively from the surface,
 III. Enhancing the reactivity of the exposed surface, thereby forming an activated exposed surface,
 IV. Removing the first liquid from the bulk part of the porous dielectric layer,
Wherein steps I, II, and III are performed while keeping the first liquid in the liquid state.

The fact that steps I, II, and III are performed while keeping the first liquid in the liquid state, implies that no freezing of the liquid need to be performed at any stage during the method. Performing steps I, II, and III while keeping the first liquid in the liquid state is advantageous compared to freezing in that it avoids the dilatation involved in the liquid-solid transition, thereby avoiding damaging the cell structure of the porous dielectric layer. Furthermore, the absence of phase transition during steps I, II, and III means that no energy needs to be spent to allow the phase transitions. Also, the absence of freezing makes removing the first liquid selectively from the surface particularly easy.

In embodiments, enhancing the reactivity of (or "activating") the exposed surface may mean making it more reactive toward a sealing layer.

In embodiments, enhancing the reactivity of the exposed surface may be performed by providing chemical groups (e.g. by forming new reactive chemical groups and/or by modifying existing chemical groups) on the exposed surface, the chemical groups being reactive. For instance, these chemical groups may be suitable for attractively interacting with a sealing layer or with a sealing layer precursor, preferably for reacting with the sealing layer or sealing layer precursor. In a preferred embodiment, enhancing the reactivity of the exposed surface means making it hydrophilic.

In embodiments, the exposed surface may be the top surface of the porous dielectric layer. When a substrate is present, the top surface may be the surface facing away from the substrate.

The embodiments permit an activation of the exposed surface of a porous dielectric layer while ensuring that the bulk of the porous dielectric layer is not activated. This advantageously permits, for instance, applying a sealing layer on the dielectric layer without or with very limited presence of the sealing layer below the exposed surface of the porous dielectric layer (inside the pores in the sub-surface region). This allows keeping the k value of the porous dielectric layer largely unchanged. Preferably, in step III, the activation of the exposed surface does not involve an etching step. For instance, plasma etching of the dielectric layer instead of a mere activation of the exposed surface could result in a modification of the filling of the pores vicinal to the etching, thereby deteriorating the protection of the pores.

In embodiments, the method may further comprise the step V of depositing a sealing layer on the activated exposed surface of the porous dielectric layer. Due to the selective activation of the exposed surface of the porous dielectric layer, the sealing layer has a tendency not to be driven below the exposed surface. This in turn results in the k value of the porous dielectric layer remaining largely unaltered. Preferably, the sealing layer may be selected in such a way as to be chemically reactive toward the activated exposed surface. In embodiments, the sealing layer may comprise groups capable to react with the reactive groups that have been introduced on the exposed surface. In an embodiment, the sealing layer may comprise a self-assembled monolayer. For instance, the self-assembled monolayer may be formed by contacting compounds of formula R—SiX$_3$ (or oligomers thereof) with the activated exposed surface, wherein X is selected from H, Cl, O—CH$_3$, O—C$_2$H$_5$, and O—C$_3$H$_7$, and wherein R is suitable for providing sealing properties or comprises reactive groups (e.g., cyano groups) capable to promote adhesion of a further sealing layer (e.g. a TiN film). In embodiments, the sealing layer can be made of any material suitable for preventing the diffusion of metal ions and/or water. The sealing layer can be either a single layer or a multilayer. This sealing layer can be deposited via any method known to the person skilled in the art. For this purpose, both liquid-based (e.g. spin coating) and gas-based (e.g. chemical vapor deposition) deposition methods may be suitable. An example of a sealing layer is a bilayer composed of a self-assembled monolayer (e.g. 11-cyanoundecyltrichlorosilane) and a TiN film thermally grown by CVD.

In embodiments, the first liquid may be an organic liquid. Organic liquids have typically a lower polarity than inorganic liquids, which is advantageous when the porous dielectric layer is of low polarity (which is typically the case).

In embodiments, the first liquid may be selected so as to be capable of forming a contact angle of less than 10° with the porous dielectric layer. This is advantageous as it translates into a good wetting of the porous dielectric layer by the first liquid, thereby enabling an efficient filling of the pores of the porous dielectric material.

In embodiments, the first liquid may have a viscosity of from 0.8 to 50 mPa·s, preferably from 1.0 to 25 mPa·s. These ranges of viscosities are advantageous as they are low enough to permit the first liquid to enter the pores but high enough to permit the first liquid to stay in the pores.

In embodiments, the first liquid may have a boiling point above 25° C., preferably above 50° C., more preferably above 100° C. This is advantageous as it minimizes or prevents evaporation of the first liquid from the pores during steps I-III. A practical upper limit for the boiling point may be 300° C.

In embodiments, the first liquid may have a flash point above 25° C., preferably above 30° C., more preferably above 40° C. This is advantageous for safety reasons but also because it correlates with a tendency for the first liquid to remain in the pores during steps I-III.

In embodiments, the first liquid may be, e.g., 2-2-aminoethoxyethanol, cyclohexanone, methyl isobutyl ketone, 1-methylimidazole, propylene carbonate, N-methyl-2-pyrrolidone, dimethyl sulfoxide, dimethylformamide, ethylene glycol, anisole, or C$_{5-8}$ alkanol.

In embodiments, the first liquid may be, e.g., 2-2-aminoethoxyethanol, cyclohexanone, methyl isobutyl ketone, 1-methylimidazole, propylene carbonate, N-methyl-2-pyrrolidone, dimethyl sulfoxide, dimethylformamide, ethylene glycol, anisole, 1-pentanol, or 1-octanol. These liquids have the advantage that they can be removed easily either by a thermal step or by rinsing with a second liquid. Furthermore, they do not induce damages to the porous layer.

In embodiments, the step (I) of filling the pores may comprise soaking the porous dielectric layer with the first liquid. For instance, the soaking time may be from 5 to 60 minutes.

The part of the porous dielectric layer comprising the exposed surface may correspond either to the entire porous dielectric layer (e.g., the bulk part and exposed surface) or to only a portion thereof (e.g., the exposed surface and a portion of the bulk part underlying the exposed surface). When the part of the porous layer comprising the exposed surface corresponds to a portion of the porous dielectric layer, it may either correspond to the exposed surface alone or to the exposed surface and to part of the porous layer underlying the exposed surface.

The part of the porous dielectric layer comprising the exposed surface preferably has a thickness of at least 0.1 nm, preferably at least 0.5 nm, more preferably at least 2 nm and most preferably at least 4 nm. Most conveniently, the part of the porous dielectric layer comprising the exposed surface corresponds to the entire porous dielectric layer.

In embodiments, the removal of the first liquid from the surface may be performed either by drying the surface or by rinsing the surface with a second liquid, the second liquid being miscible with the first liquid and having a boiling point above 25° C.

In embodiments, the drying may comprise displacing a gas relative to the porous dielectric layer. This can be performed either by keeping the porous layer immobile while contacting the porous dielectric layer with a flux of gas (e.g., air or N$_2$). This can also be performed by moving the porous dielectric layer in a stationary gas phase (e.g., air or N$_2$). For instance, this can be performed by rapidly rotating the porous dielectric. Of course, a combination of both can be used.

In step (II), the term 'selectively' means that the first liquid is removed more from the exposed surface than from the bulk of the porous dielectric layer. This step (II) of removing the first liquid selectively from the surface is preferably performed in such a way that the first liquid is only removed from the surface part of the dielectric layer.

In embodiments, the second liquid may be isopropanol or water. This is advantageous as these two liquids are environmentally friendly In embodiments, the step (III) of enhancing the reactivity of the exposed surface may be performed by contacting the exposed surface with a liquid solution suitable for making the exposed surface more reactive (e.g. more reactive toward a sealing layer). In embodiments, the liquid solution may be suitable for making the exposed surface hydrophilic.

In an embodiment, the liquid solution may be suitable for forming hydrophilic groups on the exposed surface. In an embodiment, the density of hydrophilic groups so created may be of at least 1, preferably at least 2.5, yet more preferably at least 10 and most preferably at least 20 hydrophilic groups per nm$^2$.

In embodiments, the hydrophilic groups may be hydroxyl groups. In the case of a silicon containing porous dielectric layer, the hydroxyl groups can be silanol groups (Si—OH).

In an embodiment, the liquid solution may be selected from diluted HF and an ammonia-hydrogen peroxide mixture.

In embodiments, the step (IV) of removing the first liquid from the bulk part may comprise performing a thermal treatment of the porous dielectric layer or contacting the porous dielectric layer with a third liquid, the third liquid being miscible with the first liquid and having a boiling point above 25° C. Preferably the thermal treatment comprises heating up the porous dielectric layer to a temperature above the boiling point of the first liquid for a time sufficient to remove all the first liquid from the porous dielectric layer. Alternatively to the thermal treatment or simultaneously with it, a lowering of the pressure of the environment wherein the porous dielectric layer is situated may be performed.

In embodiments, the third liquid may be isopropanol or may be water.

In a second aspect, a device is provided, preferably a semiconductor device, comprising a porous dielectric layer comprising a bulk part and a surface part, the surface part having a higher reactivity than the bulk part, the surface part having a thickness of from 0.1 to 4 nm, preferably from 0.1 to 2 nm, yet more preferably from 0.1 to 1 nm. Any device feature described in the second aspect may be used in the first aspect, and vice versa. In embodiments, the higher reactivity may be the consequence of the presence of reactive groups in on the surface part. The reactive groups may be as mentioned in the first aspect. Such a device is obtainable by the method of embodiments of the first aspect. In embodiments, the surface part may be hydrophilic while the bulk part may be hydrophobic. Such a device is advantageous as it permits the deposition of a sealing layer thereon, without that sealing layer entering pores below the exposed surface of the porous dielectric layer. This allows a porous dielectric layer having substantially the same k value before and after the deposition of the sealing layer.

In embodiments, the device may further comprise a sealing layer deposited (e.g., selectively deposited and/or chemically grafted) on the (e.g., hydrophilic) surface part, wherein the sealing layer penetrates the porous dielectric layer over a thickness of from 0 to 4 nm, preferably of from 0 to 2 nm, yet more preferably from 0 to 1 nm and more preferably does not penetrates the bulk of the porous dielectric layer. In embodiments, the sealing layer may be chemically bound to the chemical groups provided on the exposed surface.

The material constitutive of the porous dielectric layer may be any porous dielectric material.

The porous dielectric layer can for instance be supported on a substrate or can be self-supported.

The substrate can be any substrate. In embodiments, the substrate may be formed of a single layer or of more than one layer. Preferably, at least one layer is a semiconductor layer. For instance, the porous dielectric layer can be supported on a semiconductor substrate (e.g., a Si or Ge wafer). In embodiments, a non-porous dielectric layer (e.g., $SiO_2$) can be present between the semiconductor substrate and the porous dielectric layer.

The porous material constitutive of the porous dielectric layer may for instance be a nanoporous material, i.e., a material wherein the pores have on average a diameter of between 0.2 and 1000 nm, or may be a material wherein the pores have on average a diameter equal to or larger than 1 μm. Preferably, the porous material is a nanoporous material.

Nanoporous materials can be subdivided into three categories: the macroporous materials, the mesoporous materials and the microporous materials.

Macroporosity refers to pores greater than or equal to 50 nm and smaller than 1000 nm in diameter.

Mesoporosity refers to pores greater than or equal to 2 nm and smaller than 50 nm in diameter.

Microporosity refers to pores greater than 0.2 nm and smaller than 2 nm in diameter.

The embodiments can be used with nanoporous materials belonging to any of these three categories. However, a preferred family of materials for which the method according to embodiments is particularly useful is mesoporous materials and in particular mesoporous low-k materials, in particular those with a pore size of between 2 and 10 nm.

The porous material is preferably a porous low-k material.

In embodiments, the material may have a dielectric constant lower than 3.9, preferably lower than 3.5, more preferably lower than 3.0 and most preferably equal or lower than 2.4.

In embodiments, the porosity of the porous material may be interconnected (at least partly interconnected, preferably fully interconnected). When the porous material is interconnected, the method of the embodiments permits very efficient filling of all pores of at least a part of the porous dielectric material comprising the exposed surface with the first liquid, thereby assuring that, e.g., during activation of the exposed surface of the porous dielectric layer, all pores below the surface are filled with the first liquid.

A material having a fully interconnected porosity is advantageous because a first liquid as defined in any embodiment can fill all pores of a 1 μm thick material film in 2 minutes or less by contacting its top surface (if the top surface is free, e.g., has no hard mask, resist or similar material thereon).

In embodiments, the porous material may have a porosity of 10% or more, preferably 20% or more, more preferably 30% or more and most preferably 40% or more. In embodiments, the porous material may have a porosity of 80% or less. A porosity of 10% means that the pores amounts for 10% of the volume of the porous material. A greater porosity is advantageous as it may help to increase the speed of diffusion of the first liquid in the porous material. It may therefore shorten the contacting step of the method and increase its efficiency.

In an embodiment, the thickness of the dielectric porous layer may be 600 nm or less, preferably 400 nm or less, most preferably 300 nm or less.

In embodiments, the material may be a porous silicon-containing material.

Porous silicon-containing materials include, for instance, porous silica materials (e.g., not containing carbon atoms or containing less than 1% wt carbon atoms) and porous organosilicate materials (e.g., containing more than 1% wt carbon atoms). Examples of porous silica materials are silica aerogels, silica xerogels, silsesquioxanes such as hydrisosilsesquioxane (HSQ), silicalite-based films, dendrite-based porous glass and mesoporous silica amongst others.

Examples of porous organosilicates are porous carbon-doped silicon dioxides and silsesquioxanes such as alkylsilsesquioxane (e.g. methylsilsesquioxane (MSSQ)), amongst others. Preferably the porous silicon-containing material is a porous organosilicate glass.

The invention will now be described by a detailed description of several embodiments of the invention. It is clear that other embodiments of the invention can be configured according to the knowledge of persons skilled in the art without departing from the technical teaching of the invention.

Referring to FIG. 1:

FIG. 1 shows a device according to the prior art. A porous dielectric layer 2 is depicted on top of a substrate represented by two layers (e.g. a Si bottom layer overlaid by a $SiO_2$ layer). On top of the porous dielectric layer 2, a sealing layer 6 is present. Pores 4 depicted in black are filled with the material of the sealing layer 6.

Figure 2:
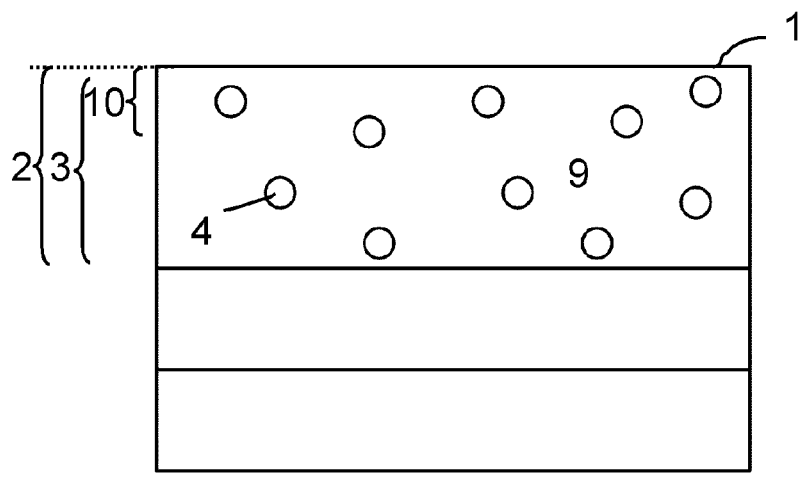
FIGS. 2-7 are diagrammatic illustrations representing different steps of a method according to an embodiment of the present invention.

Referring to FIGS. 2 to 7:

FIG. 2 shows a porous dielectric layer 2 comprising:
i. a bulk part 3 comprising a bulk material 9 and pores 4, and
ii. an exposed surface 1

Figure 3:
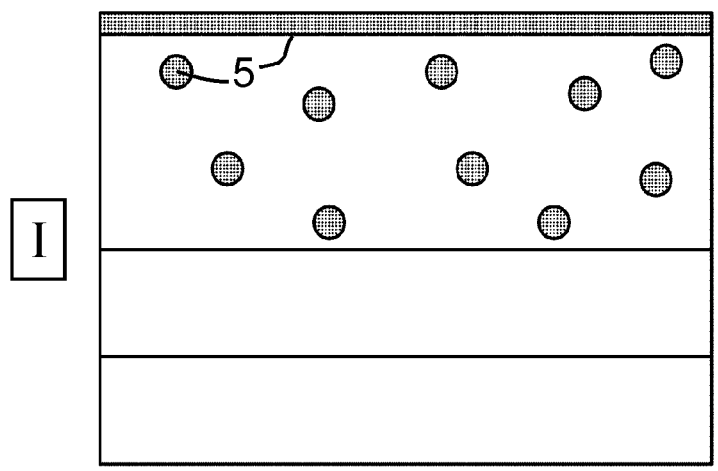

FIG. 3 illustrates the result of step I of a method for activating an exposed surface 1 of a porous dielectric layer 2 according to an embodiment. In this step I, at least the pores 4 present in a part 10 of the porous dielectric layer 2 are filled with a first liquid 5, the part 10 comprising the exposed surface 1. In the specific case of FIG. 3, all pores 4 present in the porous dielectric layer 2 are filled.

Figure 4:
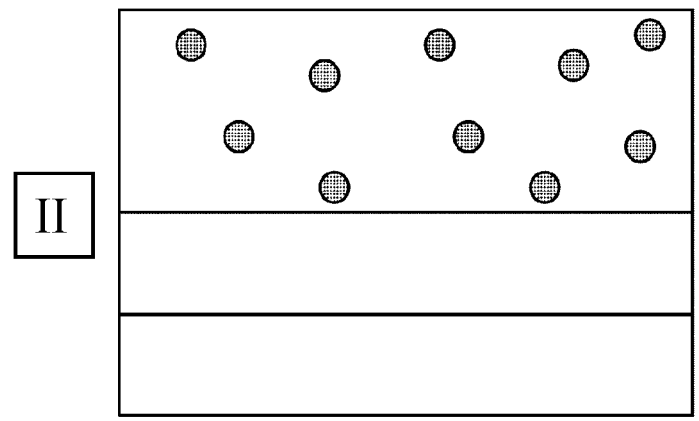

FIG. 4 illustrates the result of step II of the method wherein the first liquid 5 is selectively removed from the surface 1.

Figure 5:
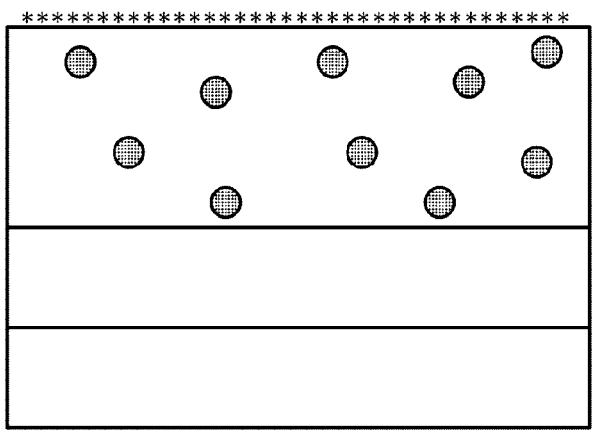

FIG. 5 illustrates the result of step III of the method wherein the exposed surface 1 is activated, thereby forming an activated exposed surface 7 more reactive than the exposed surface 1 toward a sealing layer 6.

Figure 6:
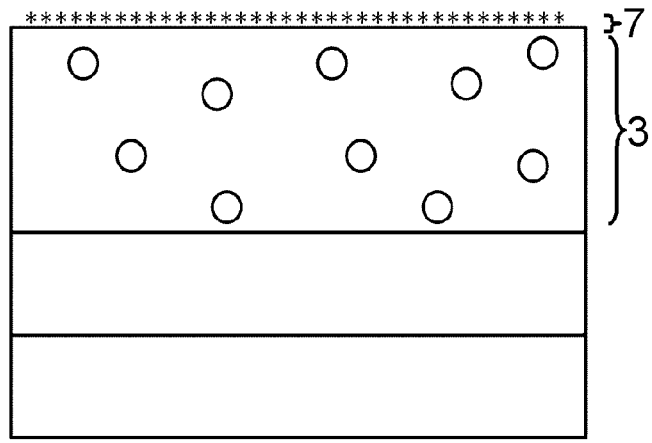

FIG. 6 illustrates the result of step IV of the method wherein the first liquid 5 is removed from the bulk part 3 of the porous dielectric layer 2.

Figure 7:
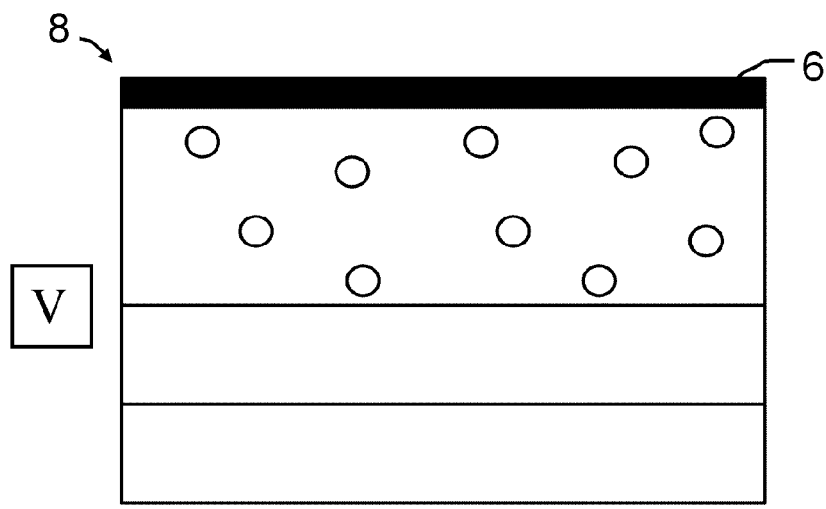

FIG. 7 illustrates the result of step V of the method wherein a sealing layer 6 is deposited on the activated exposed surface 7 of the porous dielectric layer 2. The resulting structure is a device 8 comprising a porous dielectric layer 2 comprising a bulk part 3 and a surface part 7, the surface part 7 being more hydrophilic than the bulk part and having a thickness of from 0.1 to 4 nm, the device 8 further comprising a sealing layer 6 deposited on the surface part 7, wherein the sealing layer 6 penetrates the porous dielectric layer 2 over a thickness of from 0 to 4 nm and preferably does not penetrates the bulk 3 of the porous dielectric layer 2.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, each numerical parameter should be construed in light of the number of significant digits and ordinary rounding approaches. Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

It is to be understood that although preferred embodiments, specific constructions and configurations, as well as materials, have been discussed herein for devices according to the present invention, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for enhancing the reactivity of an exposed surface of a porous dielectric layer, the method comprising:

providing a porous dielectric layer comprising a bulk part and an exposed surface, the bulk part comprising a bulk material and pores;

filling the pores in a part of the porous dielectric layer with a first liquid, wherein the first liquid is an organic liquid, and wherein the part of the porous dielectric layer comprises the exposed surface;

removing the first liquid selectively from the exposed surface by drying the surface or by rinsing the surface with a second liquid, the second liquid being miscible with the first liquid and having a boiling point above 25° C.;

enhancing a reactivity of the exposed surface by contacting the exposed surface with a liquid solution configured to make the exposed surface more reactive, wherein the liquid solution forms hydrophilic groups on the exposed surface, whereby an activated exposed surface is formed;

removing the first liquid from the bulk part of the porous dielectric layer; and depositing a sealing layer on the activated exposed surface of the porous dielectric layer.

2. The method of claim 1, wherein the first liquid is selected so as to form a contact angle of less than 10° with the porous dielectric layer.

3. The method of claim 1, wherein the first liquid has a viscosity of from 0.8 to 50 mPa·s.

4. The method of claim 1, wherein the first liquid has a viscosity of from 1.0 to 25 mPa·s.

5. The method of claim 1, wherein the first liquid has a boiling point above 25° C.

6. The method of claim 1, wherein the first liquid has a boiling point above 50° C.

7. The method of claim 1, wherein the first liquid has a boiling point above 100° C.

8. The method of claim 1, wherein the first liquid is selected from the group consisting of 2-2-aminoethoxyethanol, cyclohexanone, methyl isobutyl ketone, 1-methylimidazole, propylene carbonate, N-methyl-2-pyrrolidone, dimethyl sulfoxide, dimethylformamide, ethylene glycol, anisole, 1-pentanol, and 1-octanol.

9. The method of claim 1, wherein the hydrophilic groups are hydroxyl groups.

10. The method of claim 1, wherein the liquid solution is selected from the group consisting of diluted HF and an ammonia-hydrogen peroxide mixture.

11. The method of claim 1, wherein the removing the first liquid from the bulk part comprises performing a thermal treatment of the porous dielectric layer or contacting the porous dielectric layer with a third liquid, the third liquid being miscible with the first liquid and having a boiling point above 25° C.

* * * * *